(12) United States Patent
Vetterli et al.

(10) Patent No.: US 8,031,820 B2
(45) Date of Patent: *Oct. 4, 2011

(54) SAMPLING METHOD, RECONSTRUCTION METHOD, AND DEVICE FOR SAMPLING AND/OR RECONSTRUCTING SIGNALS

(75) Inventors: Martin Vetterli, Grandvaux (CH); Pina Marziliano, Lausanne (CH); Thierry Blu, Lausanne (CH)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/814,616

(22) Filed: Jun. 14, 2010

(65) Prior Publication Data

US 2010/0246729 A1    Sep. 30, 2010

Related U.S. Application Data

(60) Division of application No. 10/680,833, filed on Oct. 7, 2003, which is a continuation of application No. PCT/EP02/03380, filed on Mar. 26, 2002.

(30) Foreign Application Priority Data

Mar. 26, 2001  (EP) ..................... 01107530

(51) Int. Cl.
  *H04L 7/00* (2006.01)
(52) U.S. Cl. ...................................... 375/355
(58) Field of Classification Search ................ 375/263, 375/355; 327/9, 33, 45, 91; 329/361; 348/392.1, 348/405.1, 424.1
See application file for complete search history.

(56) References Cited

U.S. PATENT DOCUMENTS

| | | | |
|---|---|---|---|
| 5,687,169 A | 11/1997 | Fullerton | |
| 5,764,696 A | 6/1998 | Barnes et al. | |
| 5,812,081 A | 9/1998 | Fullerton | |
| 5,832,035 A | 11/1998 | Fullerton | |
| 5,907,427 A | 5/1999 | Scalora et al. | |
| 5,952,956 A | 9/1999 | Fullerton | |
| 5,960,031 A | 9/1999 | Fullerton et al. | |
| 5,963,581 A | 10/1999 | Fullerton et al. | |
| 5,969,663 A | 10/1999 | Fullerton et al. | |
| 5,995,534 A | 11/1999 | Fullerton et al. | |

(Continued)

FOREIGN PATENT DOCUMENTS

JP    08-336046    12/1996

(Continued)

OTHER PUBLICATIONS

International Search Authority—PCT/EP02/003380, International Search Authority—European Patent Office, Jul. 15, 2003.

(Continued)

*Primary Examiner* — Sam K Ahn
(74) *Attorney, Agent, or Firm* — Steven R. Thiel; John G. Rickenbrode

(57) ABSTRACT

Reconstruction method for reconstructing a first signal (x(t)) regularly sampled at a sub-Nyquist rate, comprising the step of retrieving from the regularly spaced sampled values ($y_{s[n]}$, y(nT)) a set of weights ($c_n$, $c_{nr}$, $c_k$) and shifts ($t_n$, $t_k$) with which said first signal (x(t)) can be reconstructed. The reconstructed signal (x(t)) can be represented as a sequence of known functions ($\gamma(t)$) weighted by the weights ($c_k$) and shifted by the shifts ($t_k$). The sampling rate is at least equal to the rate of innovation ($\rho$) of the first signal (x(t)).

22 Claims, 7 Drawing Sheets

U.S. PATENT DOCUMENTS

| Patent | Kind | Date | Inventor |
|---|---|---|---|
| 6,031,862 | A | 2/2000 | Fullerton et al. |
| 6,091,374 | A | 7/2000 | Barnes |
| 6,111,536 | A | 8/2000 | Richards et al. |
| 6,133,876 | A | 10/2000 | Fullerton et al. |
| 6,177,903 | B1 | 1/2001 | Fullerton et al. |
| 6,209,788 | B1 * | 4/2001 | Bridgelall et al. ........ 235/462.32 |
| 6,218,979 | B1 | 4/2001 | Barnes et al. |
| 6,295,019 | B1 | 9/2001 | Richards et al. |
| 6,297,773 | B1 | 10/2001 | Fullerton et al. |
| 6,300,903 | B1 | 10/2001 | Richards et al. |
| 6,304,623 | B1 | 10/2001 | Richards et al. |
| 6,351,652 | B1 | 2/2002 | Finn et al. |
| 6,354,946 | B1 | 3/2002 | Finn |
| 6,400,307 | B2 | 6/2002 | Fullerton et al. |
| 6,400,329 | B1 | 6/2002 | Barnes |
| 6,421,389 | B1 | 7/2002 | Jett et al. |
| 6,430,208 | B1 | 8/2002 | Fullerton et al. |
| 6,437,756 | B1 | 8/2002 | Schantz |
| 6,462,701 | B1 | 10/2002 | Finn |
| 6,466,125 | B1 | 10/2002 | Richards et al. |
| 6,469,628 | B1 | 10/2002 | Richards et al. |
| 6,483,461 | B1 | 11/2002 | Matheney et al. |
| 6,489,893 | B1 | 12/2002 | Fullerton et al. |
| 6,492,904 | B2 | 12/2002 | Richards |
| 6,492,906 | B1 | 12/2002 | Richards et al. |
| 6,501,393 | B1 | 12/2002 | Richards et al. |
| 6,504,483 | B1 | 1/2003 | Richards et al. |
| 6,512,455 | B2 | 1/2003 | Finn et al. |
| 6,512,488 | B2 | 1/2003 | Schantz |
| 6,519,464 | B1 | 2/2003 | Santhoff et al. |
| 6,529,568 | B1 | 3/2003 | Richards et al. |
| 6,538,615 | B1 | 3/2003 | Schantz |
| 6,539,213 | B1 | 3/2003 | Richards et al. |
| 6,549,567 | B1 | 4/2003 | Fullerton |
| 6,552,677 | B2 | 4/2003 | Barnes et al. |
| 6,556,621 | B1 | 4/2003 | Richards et al. |
| 6,560,463 | B1 | 5/2003 | Santhoff |
| 6,571,089 | B1 | 5/2003 | Richards et al. |
| 6,573,857 | B2 | 6/2003 | Fullerton et al. |
| 6,577,691 | B2 | 6/2003 | Richards et al. |
| 6,585,597 | B2 | 7/2003 | Finn |
| 6,593,886 | B2 | 7/2003 | Schantz |
| 6,606,051 | B1 | 8/2003 | Fullerton et al. |
| 6,611,234 | B2 | 8/2003 | Fullerton et al. |
| 6,614,384 | B2 | 9/2003 | Hall et al. |
| 6,621,462 | B2 | 9/2003 | Barnes |
| 6,636,566 | B1 | 10/2003 | Roberts et al. |
| 6,636,567 | B1 | 10/2003 | Roberts et al. |
| 6,636,573 | B2 | 10/2003 | Richards et al. |
| 6,642,903 | B2 | 11/2003 | Schantz |
| 6,661,342 | B2 | 12/2003 | Hall et al. |
| 6,667,724 | B2 | 12/2003 | Barnes et al. |
| 6,670,909 | B2 | 12/2003 | Kim |
| 6,671,310 | B1 | 12/2003 | Richards et al. |
| 6,674,396 | B2 | 1/2004 | Richards et al. |
| 6,677,796 | B2 | 1/2004 | Brethour et al. |
| 6,700,538 | B1 | 3/2004 | Richards |
| 6,700,939 | B1 * | 3/2004 | McCorkle et al. ............ 375/295 |
| 6,710,736 | B2 | 3/2004 | Fullerton et al. |
| 6,717,992 | B2 | 4/2004 | Cowie et al. |
| 6,748,040 | B1 | 6/2004 | Johnson et al. |
| 6,750,757 | B1 | 6/2004 | Gabig, Jr. et al. |
| 6,759,948 | B2 | 7/2004 | Grisham et al. |
| 6,760,387 | B2 | 7/2004 | Langford et al. |
| 6,762,712 | B2 | 7/2004 | Kim |
| 6,763,057 | B1 | 7/2004 | Fullerton et al. |
| 6,763,282 | B2 | 7/2004 | Glenn et al. |
| 6,774,846 | B2 | 8/2004 | Fullerton et al. |
| 6,774,859 | B2 | 8/2004 | Schantz et al. |
| 6,778,603 | B1 | 8/2004 | Fullerton et al. |
| 6,781,530 | B2 | 8/2004 | Moore |
| 6,782,048 | B2 | 8/2004 | Santhoff |
| 6,788,730 | B1 | 9/2004 | Richards et al. |
| 6,822,604 | B2 | 11/2004 | Hall et al. |
| 6,823,022 | B1 | 11/2004 | Fullerton et al. |
| 6,834,073 | B1 * | 12/2004 | Miller et al. ................... 375/130 |
| 6,836,223 | B2 | 12/2004 | Moore |
| 6,836,226 | B2 | 12/2004 | Moore |
| 6,845,253 | B1 | 1/2005 | Schantz |
| 6,847,675 | B2 | 1/2005 | Fullerton et al. |
| 6,879,878 | B2 | 4/2005 | Glenn et al. |
| 6,882,301 | B2 | 4/2005 | Fullerton |
| 6,895,034 | B2 | 5/2005 | Nunally et al. |
| 6,900,732 | B2 | 5/2005 | Richards |
| 6,906,625 | B1 | 6/2005 | Taylor et al. |
| 6,907,244 | B2 | 6/2005 | Santhoff et al. |
| 6,912,240 | B2 | 6/2005 | Kumar et al. |
| 6,914,949 | B2 | 7/2005 | Richards et al. |
| 6,917,284 | B2 | 7/2005 | Grisham et al. |
| 6,919,838 | B2 | 7/2005 | Santhoff |
| 6,922,166 | B2 | 7/2005 | Richards et al. |
| 6,922,177 | B2 | 7/2005 | Barnes et al. |
| 6,925,109 | B2 | 8/2005 | Richards et al. |
| 6,933,882 | B2 | 8/2005 | Fullerton |
| 6,937,639 | B2 | 8/2005 | Pendergrass et al. |
| 6,937,663 | B2 | 8/2005 | Jett et al. |
| 6,937,667 | B1 | 8/2005 | Fullerton et al. |
| 6,937,674 | B2 | 8/2005 | Santhoff et al. |
| 6,947,492 | B2 | 9/2005 | Santhoff et al. |
| 6,950,485 | B2 | 9/2005 | Richards et al. |
| 6,954,480 | B2 | 10/2005 | Richards et al. |
| 6,959,031 | B2 | 10/2005 | Haynes et al. |
| 6,959,032 | B1 | 10/2005 | Richards et al. |
| 6,963,727 | B2 | 11/2005 | Shreve |
| 6,980,613 | B2 | 12/2005 | Krivokapic |
| 6,989,751 | B2 | 1/2006 | Richards |
| 7,015,793 | B2 | 3/2006 | Gabig, Jr. et al. |
| 7,020,224 | B2 | 3/2006 | Krivokapic |
| 7,027,425 | B1 | 4/2006 | Fullerton et al. |
| 7,027,483 | B2 | 4/2006 | Santhoff et al. |
| 7,027,493 | B2 | 4/2006 | Richards |
| 7,030,806 | B2 | 4/2006 | Fullerton |
| 7,042,417 | B2 | 5/2006 | Santhoff et al. |
| 7,046,187 | B2 | 5/2006 | Fullerton et al. |
| 7,046,618 | B2 | 5/2006 | Santhoff et al. |
| 7,069,111 | B2 | 6/2006 | Glenn et al. |
| 7,075,476 | B2 | 7/2006 | Kim |
| 7,079,827 | B2 | 7/2006 | Richards et al. |
| 7,099,367 | B2 | 8/2006 | Richards et al. |
| 7,099,368 | B2 | 8/2006 | Santhoff et al. |
| 7,129,886 | B2 | 10/2006 | Hall et al. |
| 7,132,975 | B2 | 11/2006 | Fullerton et al. |
| 7,145,954 | B1 | 12/2006 | Pendergrass et al. |
| 7,148,791 | B2 | 12/2006 | Grisham et al. |
| 7,151,490 | B2 | 12/2006 | Richards |
| 7,167,525 | B2 | 1/2007 | Santhoff et al. |
| 7,170,408 | B2 | 1/2007 | Taylor et al. |
| 7,184,938 | B1 | 2/2007 | Lansford et al. |
| 7,190,722 | B2 | 3/2007 | Lakkis et al. |
| 7,190,729 | B2 | 3/2007 | Siwiak |
| 7,206,334 | B2 | 4/2007 | Siwiak |
| 7,209,724 | B2 | 4/2007 | Richards et al. |
| 7,230,980 | B2 | 6/2007 | Langford et al. |
| 7,239,277 | B2 | 7/2007 | Fullerton et al. |
| RE39,759 | E | 8/2007 | Fullerton |
| 7,256,727 | B2 | 8/2007 | Fullerton et al. |
| 7,271,779 | B2 | 9/2007 | Hertel |

FOREIGN PATENT DOCUMENTS

| | | | |
|---|---|---|---|
| JP | | 2002-16682 | 8/2000 |

OTHER PUBLICATIONS

Marziliano, P. et al: "Fast Reconstruction in Periodic Nonuniform Sampling of Discrete-Time Band-Limited Signals" Conference Proceedings Article, vol. 1, Jun. 5, 2000, pp. 317-320, XP010507332.

Marziliano, P. et al: "Reconstruction of Irregularly Sampled Discrete-Time Band-Limited Signals with Unknown Sampling Locations" IEEE Transactions on Signal Processing, vol. 48, No. 12, Dec. 2000, pp. 3462-3471, XP002246265.

* cited by examiner

SAMPLING METHOD, RECONSTRUCTION METHOD, AND DEVICE FOR SAMPLING AND/OR RECONSTRUCTING SIGNALS

The present invention relates to a sampling method, a reconstruction method and related devices for sampling and/or reconstructing signals.

With the increasing use of digital devices in all scientific and technical fields, the need for reliable acquisition devices equally increases. The role of these devices is to acquire the analog signals or waveforms of the continuous-time world and convert them in time-discrete digital signals which can then be processed by said digital devices, for instance to perform some computational operations such as processing, decoding or reconstructing the analog waveform. Such acquisition devices are used in many areas of science and technology, including for example scientific measurements, medical and biological signal processing, telecommunication technology, etc.

The acquisition devices sample the analog waveform at uniform sampling intervals and with a regular sampling frequency, thus generating a set of sampled values of the sampled signal. It is critical in most sampling schemes to use the smallest set of representative samples needed to fully represent and eventually allow the faithful reconstruction of the analog waveform. In other words, the smallest sampling frequency still allowing a faithful representation of the first signal is the goal.

The sampling and reconstruction methods currently used in common acquisition devices are based on the sampling theorem of Whittaker, Kotelnikov and Shannon.

This theorem states that a signal, for example a received signal y(t), bandlimited to the frequency band $[-\omega_m, \omega_m]$, can be completely represented by samples $y_s[n]$ spaced by an uniform sampling interval T if the sampling rate $2\pi/T$ is at least twice the bandwidth $\omega_m$.

This sampling scheme is represented on FIG. 1. The lowest sampling frequency $2\omega_m$ given by this theorem is commonly referred to as the Nyquist rate or Shannon frequency. In other words, the minimal sampling frequency directly depends on the bandwidth of the analog signal y(t) to sample and/or reconstruct.

The reconstruction method related to this sampling theorem allows a perfect reconstruction of a signal y(t) by superposing regularly spaced sin c functions regularly delayed by the value of one sampling interval T and weighted by the successive sampled values $y_s[n]$ of the sampled signal. This well-known reconstruction scheme is illustrated on FIG. 2, where the bloc 1 illustrates the sin c reconstruction filter.

If the signal y(t) to sample and/or reconstruct is a non-bandlimited signal, or if its bandwidth is too high to sample it at an acceptable sampling frequency, one usually filters it with a lowpass filter, thus generating a bandlimited lowpass version of the signal. This lowpass version of the signal can then be sampled and reconstructed with the above-described sampling and reconstruction schemes. The lowpass filtering can be performed by a dedicated lowpass filter circuit, by the transfer function of a transfer channel over which the signal y(t) has been transmitted, and/or by the transfer function of a measuring device or demodulating circuit used for acquiring this signal.

Therefore, when sampling and reconstructing a non-bandlimited signal y(t) or a bandlimited signal having a frequency spectrum with non-zero Fourier coefficients for frequencies higher than half of the sampling frequency $2\omega_m$, current sampling and reconstruction methods imply a distortion of the reconstructed signal with respect to the sampled signal.

In order to avoid the above mentioned problem, one usually uses a higher sampling frequency, thus allowing perfect reconstruction of a broader range of signals and minimizing distortion for non-bandlimited signals or wideband signals. A high sampling frequency however requires fast, expensive and power-consuming A/D converters, fast digital circuits and a waste of storage place for storing the digitized signal.

Furthermore, there are wide classes of very common signals, including stream of Dirac pulses, bilevel signals, piecewise polynomial signals, etc., which are not bandlimited and which therefore cannot be sampled and faithfully reconstructed by the known methods, even by increasing the sampling rate.

An aim of the present invention is to find a sampling method and a related reconstruction method for sampling at least some classes of non-bandlimited signals and for allowing an exact reconstruction of these signals from the samples generated with said sampling method.

Another aim of the present invention is to find a sampling method and a related reconstruction method for sampling at least some classes of bandlimited signals with a sampling frequency lower than the frequency given by the Shannon theorem and still allowing an exact reconstruction of these signals.

Another aim of the present invention is to find an improved method for sampling and faithfully reconstructing signals with a finite rate of innovation which can only be seen through an imperfect measuring device, a transfer channel and/or a modulating system having not necessarily a bandlimited transfer characteristic.

These aims are achieved with a sampling method and a reconstruction method including the features of the corresponding independent claim.

In particular, these aims are achieved with a new sampling method for sampling and faithfully reconstructing signals having a finite rate of innovation, i.e. having, over a finite time interval, a finite number 2K of degrees of freedom. In particular, the invention concerns the sampling and reconstruction of signals which can be completely represented by the superposition of a finite number K of known functions delayed by arbitrary shifts ($t_n$, $t_k$) and weighted by arbitrary amplitude coefficients $c_n$, $c_k$.

The Shannon theorem indicates that bandwidth limited signals can be exactly specified by sampling values $y_s[n]$ taken at uniform sampling intervals if the sampling rate is at least twice the bandwidth. The invention is based on the finding that a larger class of signals, i.e. signals having a finite number 2K of degrees of freedom over a finite time interval, can be exactly specified by a finite set of shifts and associated weights. It can be shown that, in many common cases, the minimal number of values 2K, or even 2K+1, is much lower than the number of samples required for faithfully reconstructing a signal with the existing reconstruction methods.

As an example, in the case of a CDMA communication system, each symbol (information bit) of each signal sent by each user is modulated with a coding sequence (signature) which can for example be 1023 chips long. In this case, the chip rate of the transmitted signal is thus 1023 times higher than its symbol rate. Modulating a signal with the coding sequence thus expands the signal's bandwidth by the value of the spreading factor, here 1023. Sampling and reconstructing a received CDMA signal with the conventional sampling and reconstruction methods thus requires a very fast and therefore complex and expensive analog sampling device. As the number of degrees of freedom in each received signature is at most two (shift and weight of the signature), the method of the invention can be used for sampling the received signal at a much lower rate whilst still allowing a faithful reconstruction of the sequence of symbols sent.

It is important to understand that, in the sampling method of the invention, the signal (or a filtered version of the signal) is still sampled at uniform sampling intervals, using for example common regularly clocked sampling devices. It is only for the reconstruction of the signal from the set of sampled values that a set of shifted values is computed. In most cases, those shifted values do not correspond to samples of the signal to reconstruct.

The inventive sampling method first convolves the signal x(t) with a sampling kernel and then samples the convolved signal at regular sampling intervals, both the sampling kernel and the sampling frequency being chosen such that the sampled values completely specify the first signal, thus allowing a perfect reconstruction of said first signal. The sampling frequency used for the inventive sampling method can be lower than the frequency given by the Shannon theorem, but is greater than or equal to the rate of innovation of the signal to reconstruct.

The inventive reconstruction method reconstructs a first signal x(t) from a set of sampled values taken from this signal x(t) or from a second related signal y(t) regularly sampled at a sub-Nyquist rate by retrieving from the regularly spaced sampled values a set of shifts and weights with which the first signal can be completely specified and reconstructed.

In particular, the inventive reconstruction method can be used for reconstructing, from a set of at least 2K sampled values, any signal which can be represented by the superposition of K known functions delayed by arbitrary shifts and weighted by arbitrary amplitude coefficients (weights). A preferred embodiment of the inventive reconstruction method comprises the steps of first solving a structured linear system for retrieving said arbitrary shifts and then retrieving the arbitrary weights using the previously retrieved arbitrary shifts.

Note that for some applications it may be sufficient to retrieve the shifts and that the weights are only needed if a complete reconstruction of the signal is needed. This is for instance the case during an estimation session in a CDMA decoder, when one wants to estimate the relative delays (shifts) occurred by the different users' signals along different propagation paths.

The lowest sampling frequency required in the method of the invention directly depends on the rate of innovation of the signal to sample and/or reconstruct, and not on its bandwidth as in prior art methods. More precisely, the sampling frequency required by the sampling method of the invention must be greater than or equal to the rate of innovation of the signal to sample. A minimal sampling frequency can thus be determined for any signal with a finite rate of innovation, including for some non-bandlimited signals.

In the specification and in the claims, the rate of innovation ρ of a signal is defined as the number of degrees of freedom of the signal within a time period. For example, a signal x(t) made of K weighted Dirac pulses, even if clearly not band-limited, can be fully specified by the K occurrence times (shifts) $t_k$ and by the K amplitudes (weights) $c_k$ of the Diracs. The signal can be written as $$x(t) = \sum_{k=0}^{K-1} c_k \delta(t - t_k).$$

The degree of freedom of this signal is 2K. Its rate of innovation ρ is thus finite and equal to 2K/τ, where τ is the time interval in which these K Dirac pulses occurred.

If the Dirac pulse function δ(t) is replaced by any other known function γ(t), the number of degrees of freedom of the signal obviously always stays 2K, that is K occurrence times, or shifts, $t_k$ and K amplitudes, or weights, $c_k$.

Considering the more general case of an unlimited time-continuous signal, for example a sequence of regularly spaced Dirac pulses with a space T between the pulses, the signal can be represented as $$x(t) = \sum_{n=-\infty}^{\infty} c_n \delta\left(\frac{t - nT}{T}\right)$$

where the degrees of freedom of the signal are the coefficients $c_n$. The number of degrees of freedom per time interval T is therefore equal to one. The rate of innovation of this signal is thus ρ=1/T. Such a signal could for example be a Pulse Amplitude Modulated (PAM) signal where the coefficients $c_n$ represent the value of the information data to be transmitted.

Again, replacing the Dirac pulse function δ(t) by any other known function γ(t) doesn't change the rate of innovation of the signal. The signal $$x(t) = \sum_{n=-\infty}^{\infty} c_n \gamma\left(\frac{t - nT}{T}\right)$$

thus also has a rate of innovation ρ=1/T. There are many examples of such signals, for example when γ(t) is a scaling function in a wavelet multi-resolution framework, or in approximation theory using uniform splines.

If the superposed copies of the function y(t) are shifted by arbitrary shifts $t_n$, the signal can be written as $$x(t) = \sum_{n=-\infty}^{\infty} c_n \gamma\left(\frac{t - t_n}{T}\right)$$

Assuming that the function y(t) is known, the degrees of freedom of the signals over a time interval T are the weights $c_n$ and the shifts $t_n$. Thus the rate of innovation is ρ=2π/T.

A signal could also be represented as a superposition of a determined set of functions $\{\gamma_r(t)\}_{r=0 \ldots R}$, instead of the unique function γ(t). It can thus be written as $$x(t) = \sum_{n=-\infty}^{\infty} \sum_{r=0}^{R} c_{nr} \gamma_r\left(\frac{t - t_n}{T}\right)$$

For example, $\gamma_r$ could be a Dirac, a differentiated Dirac, a polynomial function, etc. Likewise, a multi-user CDMA signal x(t) is the sum of a plurality of weighted and shifted known signatures $\gamma_r$ of the users.

Again, assuming that the functions $\gamma_r(t)$ are known, the degrees of freedom of the signal x(t) are the coefficients c nr and the time instants $t_n$. With the introduction of a counting function $c_x(t_a, t_b)$ which counts the number of degrees of freedom in the signal x(t) over a time interval [$t_a, t_b$], the rate of innovation ρ can be defined as $$\rho = \lim_{\tau \to \infty} \frac{1}{\tau} c_x\left(-\frac{\tau}{2}, \frac{\tau}{2}\right)$$

Signals with a finite rate of innovation ρ can be completely determined and faithfully reconstructed with a set of at least ρ/2 weights ($c_n$, $c_{nr}$, $c_k$) and ρ/2 shifts ($t_n$, $t_k$) per unit of time and with the knowledge of the functions $γ_r(t)$ which only depend on the class of the signal to reconstruct (stream of pulses, piecewise polynomials, etc.).

The rate of innovation ρ can also be defined locally with respect to a moving window of size τ. Given a window of time τ, the local rate of innovation $ρ_r(t)$ at time t is $$\rho_t(t) = \frac{1}{\tau} C_x(t - \tau/2, t + \tau/2).$$

In this case, as the rate of innovation ρ r of the signal determines the lowest required sampling frequency needed for sampling the signal with the inventive sampling method, it is necessary to determine the maximal local rate of innovation $ρ_{max}(τ)$ $$\rho_{max} = \max \rho_\tau(t).$$

Applications of the new sampling and reconstruction methods can be found in many technical fields, including signal processing, communication systems and biological systems. The sampling and reconstruction methods can for instance be used for sampling and reconstructing wideband communication signals, such as CDMA signals, or ultra-wideband communication signals, such as PPM signals and time-modulated ultra-wideband signals, among others.

Various embodiments of the new sampling method and of the related reconstruction method applied to different classes of signals with finite rate of innovation are explained in the specification. The one skilled in the art will understand however that the invention is not limited to the specific examples given and that advantageous technical effects can be obtained by sampling and reconstructing other kinds of signals with a finite rate of innovation.

The invention will be better understood with the help of the figures in which:

FIG. 1 diagrammatically illustrates a sampling device and method using the already known Shannon theorem.

FIG. 2 diagrammatically illustrates a reconstructing device and method using the already known Shannon theorem.

Figure 1:
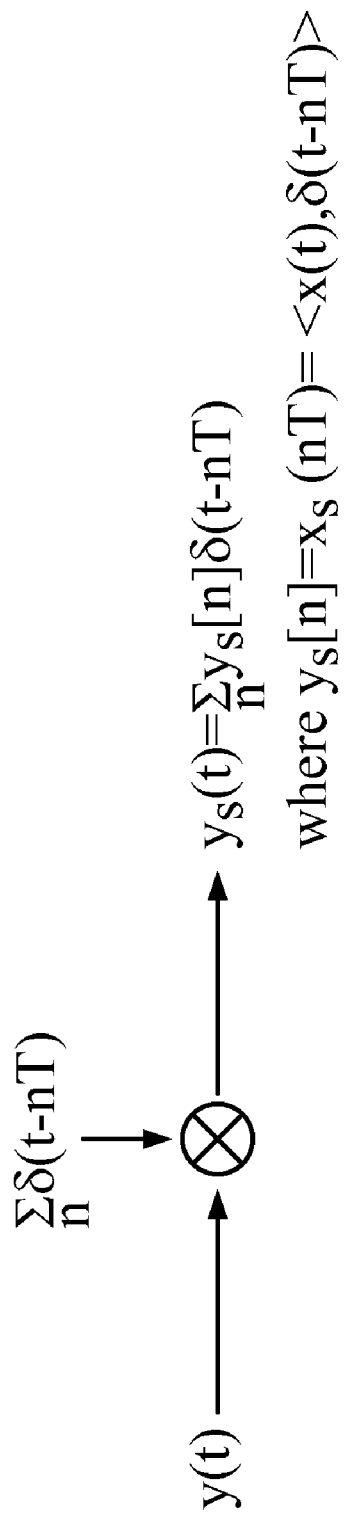
Figure 2:
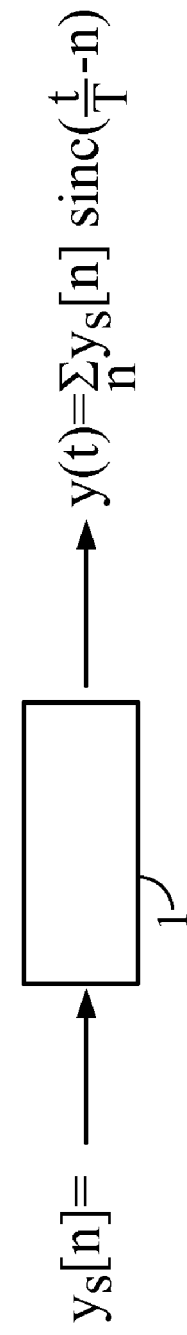
Figure 3:
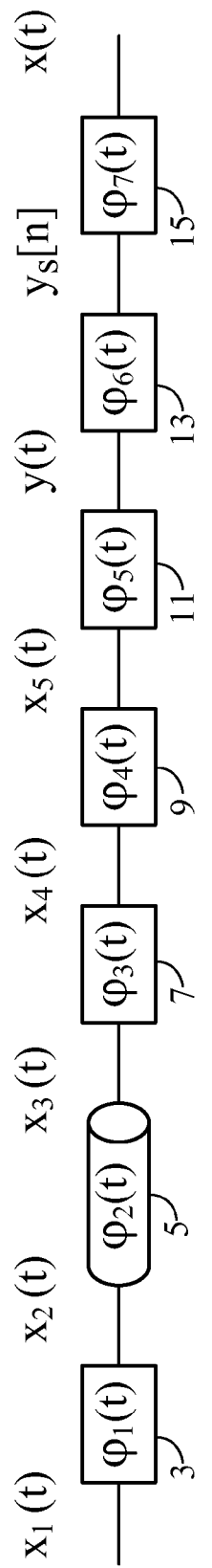
FIG. 3 illustrates a communication system in which the sampling and reconstruction method of the invention can be used for sampling the signal y(t) and reconstructing any of the signals $x_i(t)$.

FIG. 3 diagrammatically illustrates a communication system in which the sampling and reconstruction method of the invention can be used. The system comprises a signal $x_τ(t)$ which is modulated by a modulating device 3 having a known transfer function $φ_1(t)$. The resulting modulated signal $x_2(t)$ is transmitted over a transmission channel 5 with a transfer function $φ_2(t)$. Noise may be added to the signal $x_3(t)$. The transmitted signal $x_3(t)$ is acquired or measured by a measuring device 7 with a transfer function $φ_3(t)$. The measured signal $x_4(t)$ is demodulated by a demodulating device 9 with a known transfer function $φ_4(t)$. The demodulated signal $x_5(t)$ is filtered by a filter 11 with a known transfer function $φ_5(t)$, for instance a lowpass filter in the sampler. In the following, the combination of transfer functions $φ_i(t)$ by which the sampled signal y(t) is related to the signal $x_i(t)$ one wishes to reconstruct will be designated by φ(t), and the reconstructed signal will be designated x(t). The filtered signal $x_6(t)=y(t)$ is sampled at uniform sampling intervals by a sampling device 13 working at a sub-Nyquist rate, generating a set of sampled values $y_s[n]$. This set of sampled values can be stored, processed, transmitted, etc., and used by a reconstruction device 15 for reconstructing the signal y(t) or, if the transfer functions $φ_i(t)$ are known or at least if they have themselves a finite rate of innovation, any of the signals $x_i(t)$. Depending on the application, one may wish to reconstruct the sampled signal y(t) or any signal $x_i(t)$ related to the sampled signal y(t) by a known transfer function, or at least by a transfer function which has itself a finite rate of innovation.

Figure 4:
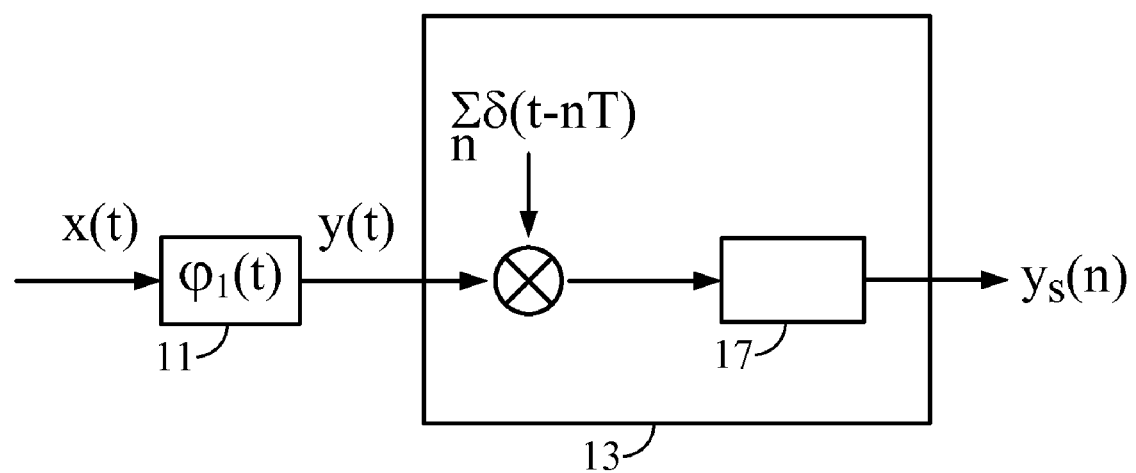
FIG. 4 illustrates a sampling device according to the invention.

FIG. 4 illustrates a sampling device 13 with a filter 11 able to carry out the sampling method of the invention. The aim of the sampling device is to generate a set of sampled values $y_s[n]$ from the signal y(t) having a known finite rate of innovation ρ, where this set of value $y_s[n]$ must completely specify the signal to reconstruct x(t).

According to the sampling method of the invention, the signal to sample x(t) is first filtered with a lowpass filter, for example with the lowpass filter 11 or with a combination of the elements 3-11 in the system of FIG. 3, having an impulse response φ(t), for instance $φ_s(t)$. Advantageously, the impulse response $φ_s(t)$ of the lowpass filter has a bandwidth of ρ/2.

Calling x(t) the signal to reconstruct, its filtered version is $$y(t)=x(t)*\overline{φ}(t)$$

where $$\overline{φ}(t)=φ(t-1)$$

is the convolution kernel (transfer function of the filter 3-11). Then, uniform sampling of y(t) with a sampling interval T leads to samples $y_s[n]$ given by:

$$y_s[n] = \langle φ(t - nT), x(t) \rangle = \int_{-\infty}^{\infty} φ(t - nT)x(t)dt$$

By choosing a sampling frequency f=1/T greater or equal to the rate of innovation of the signal x(t) to reconstruct, we will show that the samples $y_s[n]$ allow for a faithful reconstruction or decoding of the signal x(t), as will be illustrated by the not-limiting following examples.

Periodic Signals with Finite Rate of Innovation

In an embodiment, the new sampling and reconstruction methods are applied to the sampling and/or reconstruction of a periodic first signal x(t) with finite rate of innovation ρ over its period τ. As examples, we will consider streams of weighted Diracs and periodic piecewise polynomials. Although the demonstration will be made using continuous-time periodic signals, similar results could be achieved with discrete-time periodic signals.

A periodic stream of K Diracs at locations $t_k$, weighted by weights $c_k$ and with a period τ, can be written as $$x(t) = \sum_n \sum_{k=0}^{K-1} c_k \delta(t - (t_k + n\tau))$$

Figure 5:
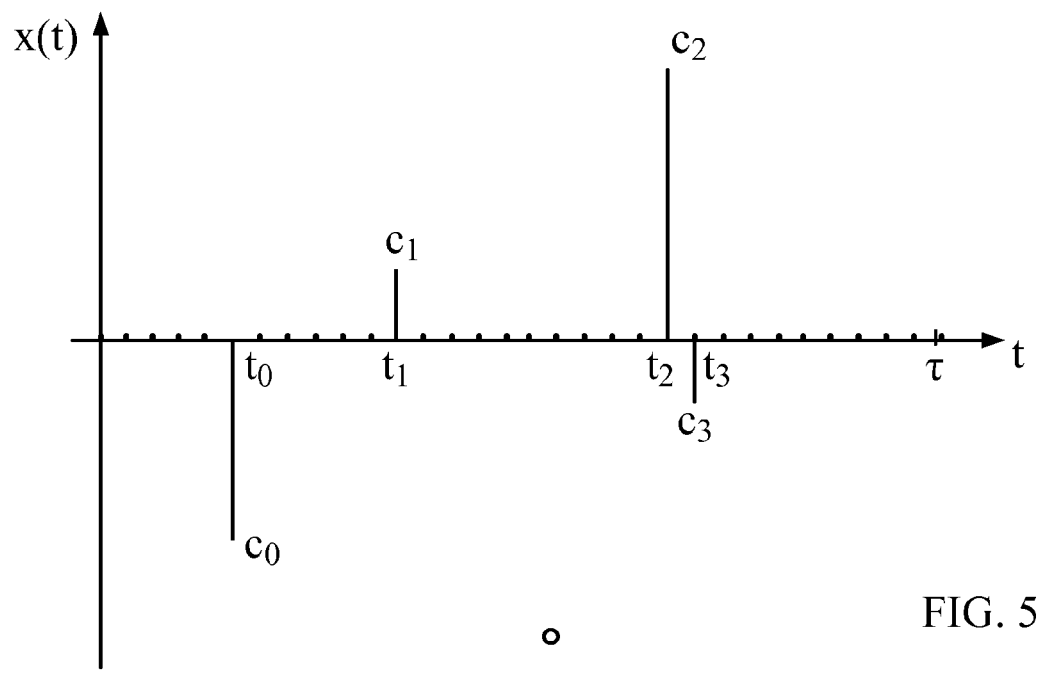
FIG. 5 shows one period τ of a periodic stream of Diracs x(t).

One period τ of a stream of Diracs x(t) is shown on FIG. 5. Each period of x(t) can thus be represented by the superposition of K Diracs delayed by shifts $t_k$ and weighted by weights $c_k$. This signal x(t) can thus be fully determined by knowing the values of the K amplitudes and the K shifts of the K Diracs. It has therefore 2K degrees of freedom per period τ and its rate of innovation ρ is equal to 2K/τ. However, the bandwidth of x(t) is clearly not limited, so that x(t) cannot be sampled and faithfully reconstructed with existing methods.

According to the sampling method of the invention, this first signal x(t) is first convolved by a filter 3-11 with a sampling function φ(t), for instance the sin c sampling kernel of bandwidth $$\left[\frac{-K}{\tau}, \frac{K}{\tau}\right],$$

and then sampled at a sampling frequency f=1/T greater than $$\frac{2K}{\tau}.$$

Figure 6:
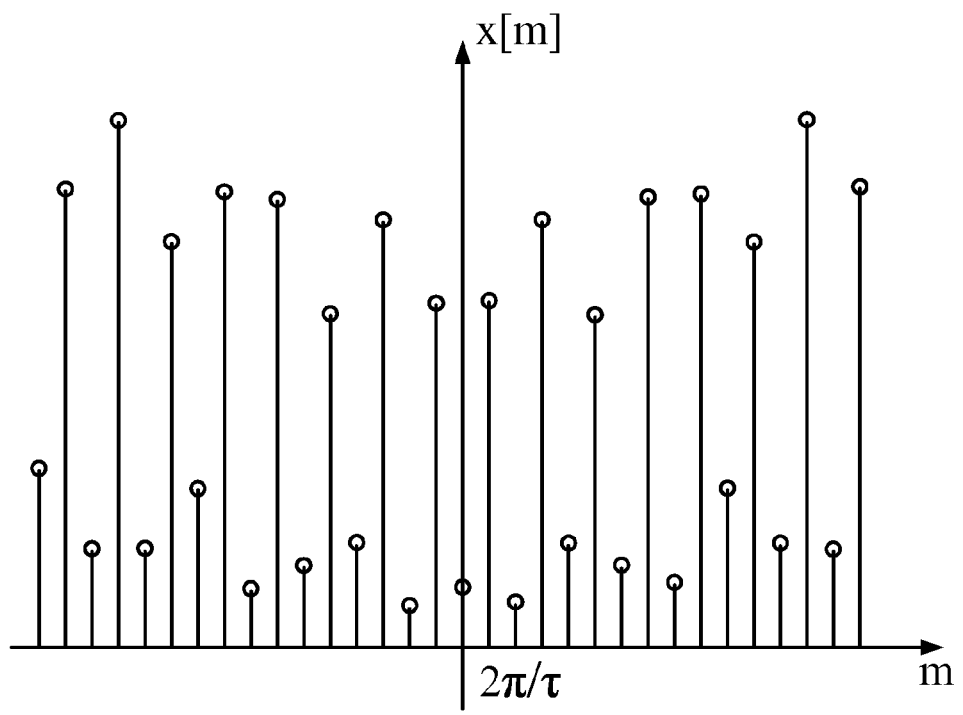
FIG. 6 shows the Fourier transformation of a periodic stream of Diracs.

The Fourier series coefficients X[m] of the signal x(t) are given by $$X[m] = \frac{1}{\tau} \sum_{k=0}^{K-1} c_k e^{-i\frac{2\pi m t_k}{\tau}} \quad \text{(Figure 6)}$$

The filtered signal y(t), resulting from the convolution of the first signal x(t) with the sin c sampling kernel of bandwidth $$\left[\frac{-K}{\tau}, \frac{K}{\tau}\right]$$

is a lowpass approximation of the first signal x(t) given by $$y(t) = \sum_{m=-K}^{K} X[m] e^{i\frac{2\pi m t}{\tau}}$$

Figure 7:
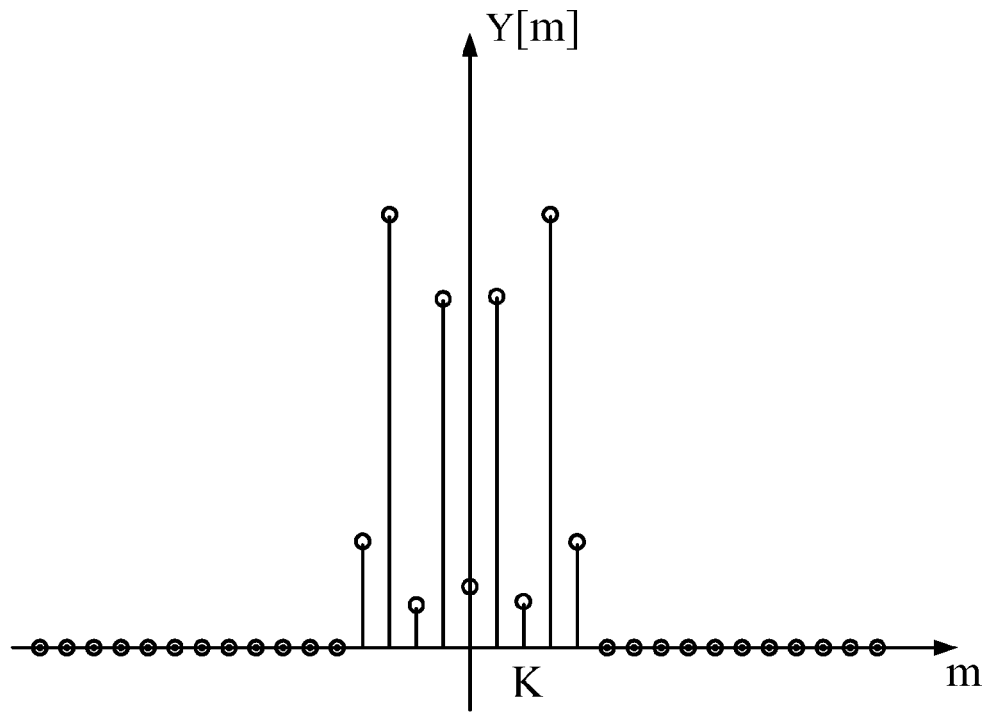
FIG. 7 shows the Fourier transformation of a bandlimited periodic stream of Diracs.

FIG. 7 shows the Fourier series Y[m] coefficients of y(t).

Figure 8:
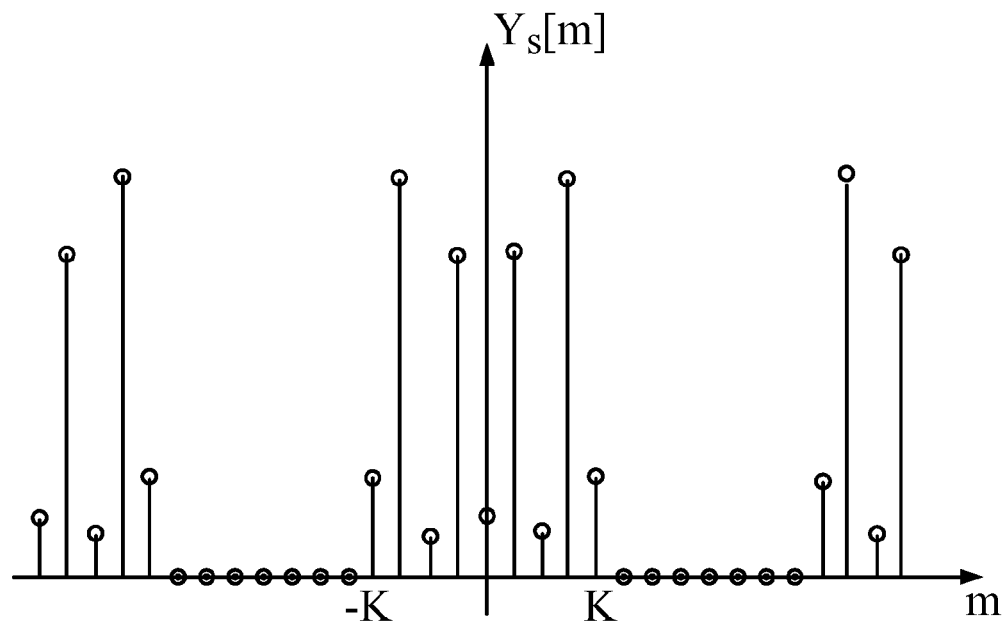
FIG. 8 shows the Fourier transformation of a sampled bandlimited, periodic stream of Diracs.

Sampling one period τ of the filtered signal y(t) at multiples of T, we obtain M=τ/T sampled values $y_s[n]$. In a preferred embodiment, T is a divider of τ.

$$y_s[n] = y(nT) = \sum_{m=-K}^{K} X[m] e^{i\frac{2\pi m n T}{\tau}} = \langle x(t), \varphi(t - nT) \rangle$$

where $n \in [0, \tau/T - 1]$.

y(nT) is periodic with a period τ/T. FIG. 8 shows the Fourier series coefficients $Y_s[m]$ of $y_s[n]$. The Fourier coefficients $Y_s[m]$ can be computed from the set of N sampled values y(nT) of the filtered signal y(t) by using for instance the well-known Fast Fourier Transform (FFT) method.

It can be shown that if the number τ/T of samples per period is greater than or equal to 2K+1, the samples $y_s[n]$ are a sufficient representation of x(t).

The following method can be used for reconstructing the signal x(t) from the coefficients $Y_s[m]$. The Fourier coefficients X[m], computed from the samples $y_s[n]$ with a known method, are a linear combination of K complex exponentials:

$$u_k^m = e^{-i\frac{2\pi m t_k}{\tau}}$$

The shifts $t_k$ of the K Diracs can be determined from the samples using for instance an annihilating filter. A filter $(1-z^{-1}u_k)$ is called an annihilating filter for $u_k^m$ if $$(1 - Z^{-1}u_k)u_k^m = 0$$

In order to find the shifts $t_k$, an annihilating filter H(z) has to be determined whose coefficients are (1, H[1], H[2], ..., H[K]) or $$H(z) = 1 + H[1]z^{-1} + H[2]z^{-2} + \ldots + H[K]z^{-K} = \sum_{m=0}^{K} H[m]z^{-m}$$

and which annihilates each exponential $u_k^m$. It can be shown that the K shifts of the Diracs $\{t_0, t_1 \ldots t_{k-1}\}$ are given by, or at least can be retrieved from the zeros of the filter H(z).

The filter H(z) can be found by solving the following structured linear equation system for H:

$$\begin{bmatrix} X[0] & X[-1] & \ldots & X[-(K-1)] \\ X[1] & X[0] & \ldots & X[-(K-2)] \\ \vdots & & & \vdots \\ X[K-1] & X[K-2] & \ldots & X[0] \end{bmatrix} \cdot \begin{bmatrix} H[1] \\ H[2] \\ \vdots \\ H[K] \end{bmatrix} = -\begin{bmatrix} X[1] \\ X[2] \\ \vdots \\ X[K] \end{bmatrix}$$

Because the matrix is a Toeplitz system, fast algorithms are available for finding the solution. This system has a unique solution if the first matrix is invertible, which is the case if all K Diracs in x(t) are distinct, that is if $t_k \neq t_1$, $\forall k \neq 1$.

Given the coefficients 1, H[1], H[2], ..., H[K] the filter H(z) can be factored into its roots $$H(z) = \prod_{k=0}^{K-1} (1 - u_k z^{-1})$$

which leads to the K shifts $t_k$ using the above given relation between $u_k$ and $t_k$.

Given the shifts $t_k$, the K values of the weights $c_k$ can be found by solving $$X[m] = \frac{1}{\tau}\sum_{k=0}^{K-1} c_k e^{-i\frac{2\pi m t_k}{\tau}}$$

which leads to the following Vandermonde system $$\begin{bmatrix} X[0] \\ X[1] \\ \vdots \\ X[K-1] \end{bmatrix} = \frac{1}{\tau}\begin{bmatrix} 1 & 1 & \ldots & 1 \\ u_0 & u_1 & \ldots & u_{K-1} \\ & & \vdots & \\ u_0^{K-1} & u_1^{K-1} & \ldots & u_{K-1}^{K-1} \end{bmatrix} \cdot \begin{bmatrix} c_0 \\ c_1 \\ \vdots \\ c_{K-1} \end{bmatrix}$$

which again has a unique solution when the K shifts $t_k$ are distinct, $t_k \neq t_1$, $\forall k \neq 1$. Because the matrix is a K×K Vandermonde equation system, known fast solution methods are available.

This result can easily be extended to a periodic stream of differentiated Diracs:

$$x(t) = \sum_{n=-\infty}^{\infty} \sum_{r=0}^{R_n-1} c_{nr}\delta^{(r)}(t-t_n)$$

with the periodicity conditions $t_{n+K}=t_n+\tau$ and $c_{n+K,r}=c_{nr}$ for all n.

This first signal x(t) is entirely determined by the K shifts $t_k$ and the K' weights $c_{nr}$, where $$K' = \sum_{k=0}^{K-1} R_k,$$

which makes at most K+K' degrees of freedom per period $\tau$. The rate of innovation $\rho$ is thus $$\rho = \frac{K+K'}{\tau}.$$

Applying the new sampling method as in the previous examples, this signal is first convolved with a sampling kernel of a bandwidth B greater than or equal to the rate of innovation $\rho$ of said first signal x(t), then sampled at a frequency greater than or equal to the maximum between B and $\rho$. Note that even sampling at a frequency $\rho$ when the bandwidth B is greater than the rate of innovation $\rho$ leads to a limited number of solutions among which the good solution may often be guessed.

The so generated sampled values y(nT) will then be sufficient to recover the spectral values X[m] using similar steps of the variant embodiment of the reconstruction method used in the case where x(t) is a periodic stream of weighted Diracs, leading then similarly to the recovery of the shifts $t_k$ and the K' weights $c_{nr}$.

We will now extend this result to signals x(t) belonging to the class of periodic piecewise polynomial signals of period $\tau$, containing in each period K pieces of maximum degree R. If we differentiate a periodic piecewise polynomial x(t) R+1 times, we obtain a stream of K weighted and shifted Diracs or derivative of Diracs:

$$x^{(R+1)}(t) = \sum_{n=-\infty}^{\infty} \sum_{r=0}^{R_n-1} c_{nr}\delta^{(r)}(t-t_n)$$

Periodic piecewise polynomials signals x(t) are thus entirely determined by K shifts $t_k$ and K'=(R+1)K weights. The rate of innovation $\rho$ is $$\rho = \frac{(R+2)K}{\tau}.$$

The Fourier coefficients of the derivative operator is defined by $D[m]=i2\pi m$ and therefore the Fourier coefficients $X^{(R+1)}[m]$ of the differentiated signal $x^{(R+1)}(t)$ are equal to $$X^{(R+1)}[m]=(i2\pi m/\tau)^{R+1}X[m]$$

with the periodicity conditions $t_{n+K}=t_n+\tau$ and $c_{n+K,r}=c_{nr}$ for all n.

This first signal x(t) is entirely determined by the K shifts $t_k$ and the K'=(R+1)K weights. The rate of innovation $\rho$ is thus $$\rho = \frac{(R+2)K}{\tau}.$$

Applying the new sampling method as in the previous example, x(t) is first convolved with a kernel $\phi(t)$ of a bandwidth B greater than or equal to the rate of innovation $\rho$ of said first signal x(t), for example with the differentiated sin c sampling kernel, or with another differentiated kernel.

We can then take $\tau/T$ samples regularly spaced apart in order to get a set of values $y_s[n]$ from which the periodic piecewise polynomial signal of degree Rx(t) can be faithfully reconstituted using the previously described annihilating filter method.

A similar reconstruction method can be applied for sampling and reconstructing periodic non-uniform splines of degree R, i.e. signals whose (R+1)th derivative is a periodic stream of K weighted and shifted Diracs. Likewise, a similar reconstruction method can be applied for periodic filtered piecewise polynomial signals.

Furthermore, this sampling and reconstruction method can be applied to piecewise bandlimited signals, i.e. to signals which are bandlimited except for jumps or discontinuities. Piecewise bandlimited signals can be seen as the sum of bandlimited signals with a stream of Diracs and/or with a piecewise polynomial signal:

$x(t)=x_{BL}(t)+x_{PP}(t)$ where $x_{BL}(t)$ is a L-Bandlimited signal and $x_{PP}(t)$ is a piecewise polynomial signal.

The Fourier coefficients X[m] are defined by $$X[m]\begin{cases} X_{BL}[m]+X_{pp}[m] & \text{if } m \in [-L,L] \\ X_{pp}[m] & \text{if } m \notin [-L,L] \end{cases}$$

The Fourier coefficients of the signal x(t) outside of the band [−L,L] are exactly equal to the Fourier coefficients of the piecewise polynomial. Therefore it is sufficient to take at least 2K(R+1) Fourier coefficients outside of the band [−L,L] to retrieve the signal $x_{PP}(t)$. The Fourier coefficients of the bandlimited signal are then obtained by subtracting $X_{PP}[m]$ from X[m] for m∈[−L, L].

As a piecewise polynomial signal has 2K(R+1) and the bandlimited signal 2L+1 degrees of freedom, we can sample the signal x(t) using a periodized differentiated sin c sampling kernel bandlimited to 2L+4K(R+1)+1, because of symmetry constraints.

Finite Length Signals with Finite Rate of Innovation

A finite length signal with finite rate of innovation p clearly has a finite number of degrees of freedom. We will illustrate with several examples that those signals can be uniquely specified with a finite set of samples, and that the minimal number of samples in the set only depends on the number of degrees of freedom of the signal, but not on its bandwidth.

Consider first a continuous time signal x(t) with a finite number of weighted Diracs:

$$x(t) = \sum_{k=0}^{K-1} c_k \delta(t - t_k)$$

x(t) clearly has 2K degrees of freedom, K from the weights $c_k$ and K from the shifts $t_k$ of the Diracs. We will see that N samples, N being greater than 2K, preferably greater than 2K+1, will be sufficient to recover the signal x(t), and describe an appropriate reconstruction method. Similar to the previous cases, the reconstruction method will require solving two systems of linear equations: one for the shifts of the Diracs and one for the weights of the Diracs.

In a first embodiment, the signal x(t) is filtered with a sin c kernel φ(t), as an example of infinite length sampling kernel. Sampled values $y_s[n]$ of x(t) are obtained by filtering x(t) with the sin c(t/T) sampling kernel:

$$y_s[n] = <x(t), \sin c(t/T-n)>, n=0, \ldots, N-1$$

By developing the inner product one shows that $$y_s[n] = \frac{(-1)^n}{\pi} \sum_{k=0}^{K-1} c_k \sin(\pi t_k/T) \cdot \frac{1}{(t_k/T - n)}$$

This leads to:

$$Y_n = (-1)^n P(n) y_s[n] = \frac{1}{\pi} \sum_{k=0}^{K-1} c_k \sin(\pi t_k/T) P_k(n)$$

where $P(u) = \sum_{k=0}^{K} p_k u^k$ has zeros at locations $t_l/T$ for l=0, . . . , K−1

The right-hand side of this expression is a polynomial of degree K−1 in the variable n, thus applying K finite differences makes the left-hand side vanish, that is $$\Delta^k((-1)^n P(n) y_s[n]) = 0 \text{ for } n = K, \ldots, N-1$$

$$\Leftrightarrow \sum_{k=0}^{K} p_k \Delta^k ((-1)^n n^k y_s[n]) = 0$$

The $p_k$ can be retrieved by solving this system. With the $p_k$, the K roots of the polynomial P(u) can be retrieved, and thus the shifts $t_k=Tu_k$. Once the shifts $t_k$ have been retrieved, the weights $c_k$ can be found with the above described method, i.e. by solving a linear system of equations.

The above method for reconstructing a signal which has been filtered by a sin c transfer function is easy to carry out and elegant. However, in the real world, many signals are measured by a measuring device 7 respectively transmitted over a channel 5 having a transfer function which can be more precisely approximated by a Gaussian transfer function $\phi_o(t)$. It can be shown that similar to the sin c sampling kernel, 2K sample values $y_s[n]$ obtained by filtering the signal with a Gaussian kernel $\phi_o(t)$ are sufficient to represent the signal x(t).

This can be demonstrated by computing the sample values $$y_s[n] = <x(t), e^{-(t/T-n)^2/2\sigma^2}> = \sum_{k=0}^{K-1} c_k e^{-(t_k/T-n)^2/2\sigma^2}$$

By expanding and regrouping the terms so as to have variables that depend solely on n and solely on k, we obtain:

$$Y_n \sum_{k=0}^{K-1} a_k u_k^n$$

where we have $Y_n = e^{n^2/2\sigma^2} y_x[n]$, $a_k = c_k e^{-t_k^2/2\sigma^2 T^2}$ and $u_k = e^{t_k \sigma^2 T}$. $Y_n$ is a linear combination of real exponentials. Thus the annihilating filter method can be used to find the K values $u_k$ and $a_k$. This means that the values $u_k$ can be solved by finding the roots of an annihilating filter chosen such that $$h * Y = 0$$

$$\Leftrightarrow \sum_{k=0}^{K} h_k Y_{n-k} = 0, n = K, \ldots, N-1$$

From the $u_k$, the shifts $t_k$ can be retrieved using $t_k=\sigma^2 T \ln u_k$. Once the shifts $t_k$ are obtained then we solve for $a_k$ a Vandermonde equation system. The weights $c_k$ are simply given by $c_k = a_k e^{t_k^2 2\sigma^2 T^2}$ Infinite Length Signals with Local Finite Rate of Innovation In this section, we will describe a sampling and local reconstruction method for sampling and reconstructing infinite length signals x(t) with a finite local rate of innovation $\rho_\tau(t)$ with respect to a moving window of size t. We will in particular describe bilevel signals, and explain local reconstruction methods using sampling kernels with a compact support. Those results could be generalized to other B-splines of different degree d.

Figure 9:
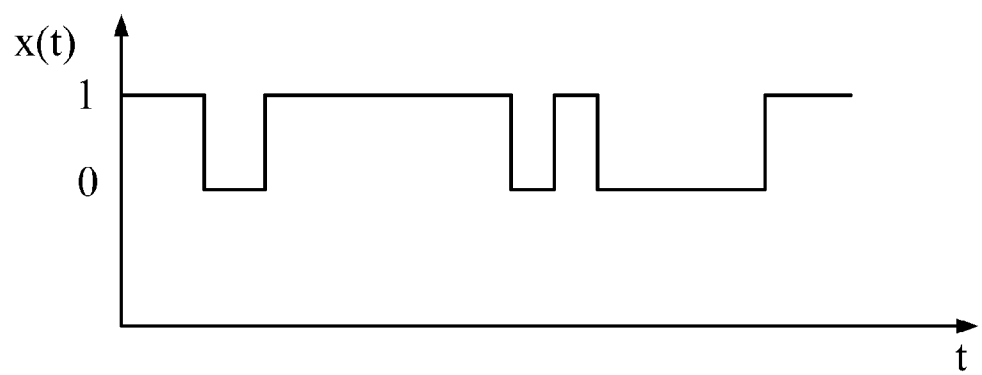
FIG. 9 shows an example of bilevel signal.

Bilevel signals x(t) are infinite length continuous-time signals which take on two values, 0 and 1, with a known initial condition, for example x(0)=1. These signals are completely represented by their transition values (shifts) $t_k$. Suppose the signal x(t) has a finite local rate of innovation ρ as described above. This is the case of most signals produced by electronic digital circuits, where the rate of innovation is usually limited by the clocking of the integrated circuit generating the signal. Examples of common bilevel signals with a finite local rate of innovation include amplitude or modulation pulses or PAM, PPM signals among others. An example of bilevel signal is shown on FIG. 9.

Figure 10:
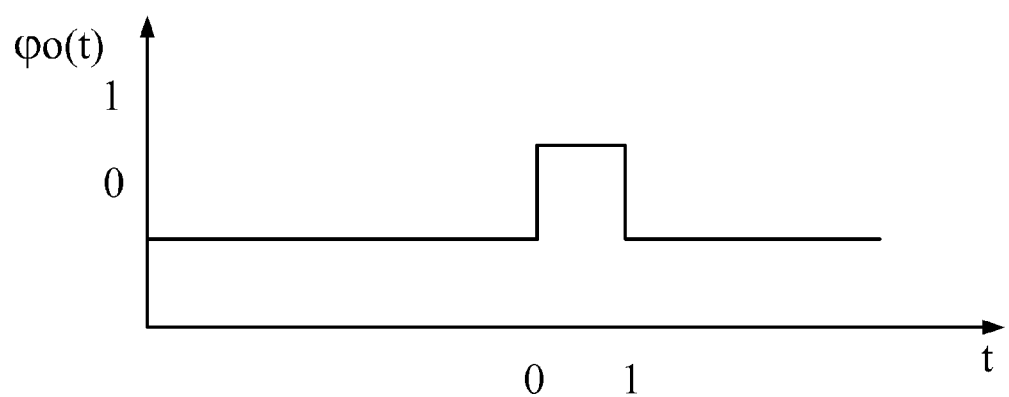
FIG. 10 shows a box spline $φ_0(t/T)$.

If a bilevel signal is sampled with a box spline $\phi_0(t/T)$ shown on FIG. 10, then the sample values $y_s[n]$ are given by the inner product between the bilevel signal and the box function:

$$y_s[n] = <x(t), \varphi_0(t/T-n)> = \int_{-\infty}^{\infty} x(t)\varphi_0(t/T-n)\,dt$$

The sample value $y_s[n]$ simply corresponds to the area occupied by the signal $x(t)$ in the interval $[nT, (n+1)T]$. Thus, if there is at most one transition per box, then we can recover the transition from the sample. The non-bandwidth limited signal $x(t)$ is thus uniquely determined from the finite set of samples $y_s[n]$.

Figure 11:
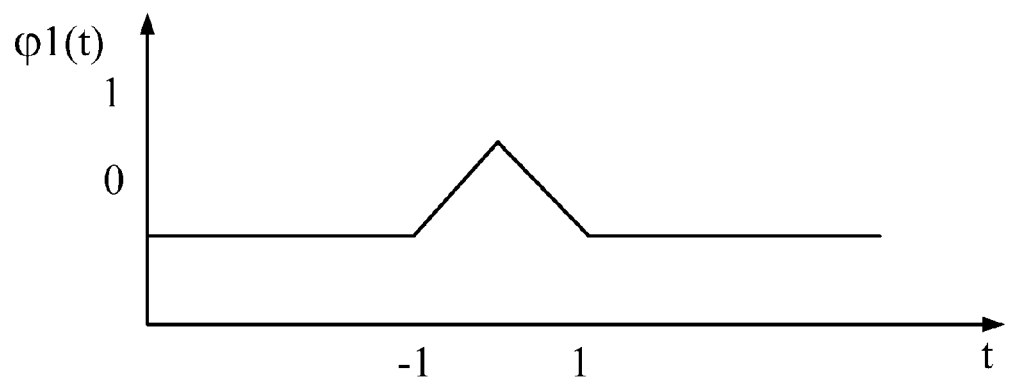
FIG. 11 shows a hat spline $φ_1(t/T)$.

However, if the bilevel signal $x(t)$ is shifted by an unknown shift, then there may be two transitions in an interval of length T and one box function will not be sufficient to recover the transitions. To sample this signal, one can use a sampling kernel $\phi(t/T)$ with a larger support and with added information. For example, the hat spline function defined by $$\varphi_1(t) = \begin{cases} 1-|t| & \text{if } |t|<1 \\ 0 & \text{else} \end{cases} \quad \text{(Fig. 11)}$$

leads to two sample values in each interval $[nT, (n+1)T]$ with which the maximum two transitions time $t_k$ (shifts) in the intervals can be uniquely retrieved.

In fact, if there are at most 2 transitions in the interval $[n, n+2]$, then the possible configurations are (0,0), (0,1), (0,2), (1,0), (1,1), (2,0)

where the first and second component indicate the number of transitions in the intervals $[n, n+1]$ and $[n+1, n+2]$ respectively.

Since the hat sampling kernel is of degree one, we obtain for each configuration a quadratic system of equations with variables $t_0, t_1$:

$$y_n = \int_{n-1}^{n} x(t)(1+t-n)\,dt + \int_{n}^{n+1} x(t)(1-(t-n))\,dt$$

$$y_{n+1} = \int_{n}^{n+1} x(t)(1+t-(n+1))\,dt + \int_{n+1}^{n+2} x(t)(1-(t-(n+1)))\,dt$$

It can easily be shown that this system of equation admits one solution and that this solution is unique.

Similarly, infinite length piecewise polynomial signals with a local finite rate of innovation can be sampled and reconstructed with a box sampling kernel. Consider an infinite length piecewise polynomial signal $x(t)$ where each piece is a polynomial of degree R and defined over an interval $[t_{k-1}, t_k]$, that is, $$x(t) \begin{cases} x_0(t) = \sum_{m=0}^{R} c_{0m}t^m & t \in [0, t_0] \\ x_1(t) = \sum_{m=0}^{R} c_{1m}t^m & t \in [t_0, t_1] \\ \ldots \\ x_K(t) = \sum_{m=0}^{R} c_{Km}t^m & t \in [t_{K-1}, t_K] \\ \ldots \end{cases}$$

Each polynomial piece $x_k(t)$ contains R+1 unknown coefficients $c_{km}$. The transition values are easily obtained once the pieces $x_{k-1}(t)$ and $x_k(t)$ are determined, thus there are 2(R+1)+1 degrees of freedom. If there is one transition in an interval of length T then the maximal local rate of innovation is $\rho_m(T)=(2(R+1)+1)/T$. Therefore, in order to recover the polynomial pieces and the transition we need to have at least 2(R+1)+1 samples per interval T. This can be achieved for example by sampling with the following box sampling kernel:

$$\varphi_0\left(t \Big/ \frac{T}{2(R+1)+1}\right)$$

For example, if the signal $x(t)$ to reconstruct is a piecewise linear signal (R=1) with maximal one transition in each interval T, then we need at least 5 samples per interval.

We can generalize this case by noting that the Rth derivative of a piecewise polynomial of degree R is a piecewise constant signal which can be sampled and reconstructed using the same method.

Multidimensional Signals

The sampling and reconstruction method of the invention is not restricted to one-dimensional signals, but can also be used with multidimensional signals. For example, an interesting case appears with two-dimensional images, where bilevel and multi-level signals are quite common. Furthermore, many two-dimensional picture signals have a finite length and can only be seen through an optical system with a transfer function which is at least approximately Gaussian.

Figure 12:
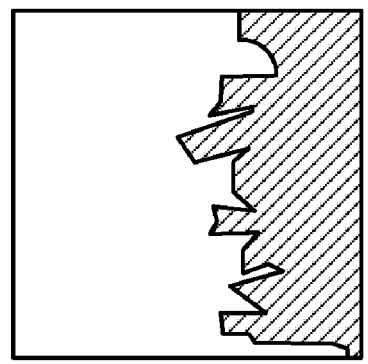
FIG. 12 illustrates a two-dimensional picture signal with a 0/1 transition given by an arbitrary function.
Figure 13:
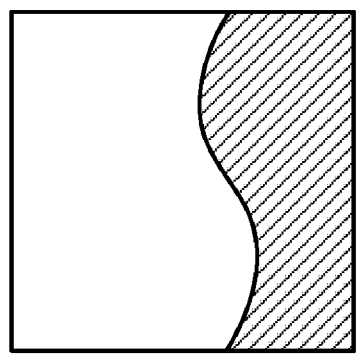
FIG. 13 illustrates a two-dimensional picture signal with a 0/1 transition given by a smooth, for example a bandlimited, function.
Figure 14:
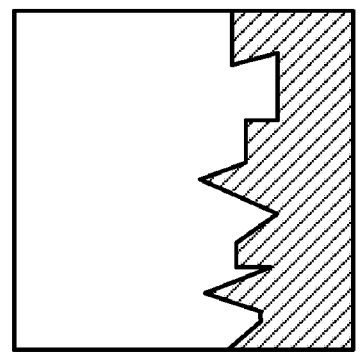
FIG. 14 illustrates a two-dimensional picture signal with a 0/1 transition given by a piecewise polynomial function.

Consider the cases shown on FIGS. 12, 13 and 14:

FIG. 12: unit square with a 0/1 transition given by an arbitrary function.

FIG. 13: unit square, with a 0/1 transition given by a smooth, for example bandlimited, function.

FIG. 14: unit square, with a 0/1 transition given by a piecewise polynomial function.

The sampling and reconstruction method developed in the previous sections can be applied on a set of lines, for example on a square grid, through the square. Obviously, a perfect reconstruction of the boundaries shown on FIGS. 13 and 14 is possible, but a priori not for the case illustrated on FIG. 12. Depending on the a-priori known class of function to which the boundary function belongs, a different sampling kernel $\phi(t)$ will be used for sampling lines through the image and to allow a perfect reconstruction of the image if the sampling is fine enough. For instance, if the image is piecewise polynomial with boundaries that are either bandlimited or piecewise polynomial, then separable one-dimensional sampling using spline kernels is possible that allows, with the above described method, a perfect reconstruction of the boundary and thus of the bilevel image, if the sampling is fine enough, i.e. if the sampling rate is higher than the rate of innovation of the boundary function.

Instead of scanning a picture along lines with a one-dimensional sampling kernel, one can scan it with a two-dimensional sampling kernel. Indeed, this is exactly what a scanner or a digital camera does: the image is first filtered by the optical system which has a two-dimensional $\phi(x,y)$ transfer function and then sampled at regular intervals by the matrix sensor. In fact, the above-described methods can also be applied to two-dimensional signals which need to be filtered by a two-dimensional sampling kernel and sampled by a two-dimensional sampling system with a sampling rate at least equal to the two-dimensional rate of innovation.

The newly defined class of signals with finite rate of innovation p includes a broad variety of signals of which the examples discussed above are only a subset. The new sampling method can however be applied to many signals x(t) with a finite rate of innovation p, regularly sampled so as to generate a set of sampled values y(nT) at a sampling frequency f=1/T greater than said rate of innovation p, said sampled values y(nT) representing entirely the first signal x(t). Depending on the form of the resulting equation system which only depends on the class of signal to reconstruct, there can be an easy solution method for retrieving the shifts and weights.

In the above-described embodiments, the new sampling and reconstruction methods are applied to sample and/or reconstruct a noiseless first signal x(t). The one skilled in the art will however recognize that in applications with noisy conditions, the same methods can be used with a higher sampling frequency, thus providing a higher number of sampled values x(nT). The corresponding equation systems described above can then be solved using well-known spectral estimation techniques, such as for example the singular value decomposition (SVD) method, in order to overcome the uncertainty induced by the noise.

In the above described embodiments, the sampled signal $y_s[n]$ is used for reconstructing the signal y(t) before sampling, or at least a signal x(t) related to y(t) by a transfer function $\phi(t)$. The one skilled in the art will understand however that the sample values $y_s[n]$, or even the sets of shifts $t_k$ and weights $c_k$ retrieved from those sample values, can be stored, transmitted and processed. In particular, a set of values $y_{s1}[n]$ obtained by sampling a first signal $y_1(t)$ at a sub-Nyquist rate can be added to a second set of values $y_{s2}[n]$ obtained by sampling a second signal $y_2(t)$ at a sub-Nyquist rate. The rate of innovation $\rho$ s of the signal $y_s(t)=y_1(t)+y_2(t)$ is obviously the sum of the rates of innovation $\rho_1$, $\rho_2$ of the summed signals $y_1(t)$ and $y_2(t)$. Therefore, for the sum of the sampled values to be a sufficient representation of $y_s(t)$, the number of samples of the signal $y_s(t)$ in a time interval must be greater than the sum of the number of degrees of freedom of the two added signals in this time interval. Therefore, if one wishes to perform some processing operations on the set of sampled values, one may increase the sampling rate in order to have a sufficient number of samples in the processed signal.

The sampling method and the reconstruction method of the invention can be performed by hardware circuits or systems and/or by a computer program product, including memories in which a software or a firmware has been stored and a computer program product directly loadable into the internal memory of a digital processing system and comprising software code portions for performing the above described methods. Accordingly, the invention also relates to a circuit, to a system and to a computer program product adapted to carry out the above described methods, and to a processing circuit or program for processing sets of values obtained by sampling a signal with the above described method.

The invention claimed is:

1. A method for reconstructing a first signal (x(t)), the method comprising:
    sampling a second signal (y(t)) at a sub-Nyquist rate and at uniform intervals;
    generating a set of sampled values ($y_s[n]$, y(nT)) from the second signal (y(t));
    retrieving, using a digital processing system, from said set of sampled values a set of shifts ($t_n$, $t_k$) and weights ($c_n$, $c_{nr}$, $c_k$); and
    reconstructing, using the digital processing system, the first signal (x(t)) based on the set of shifts ($t_n$, $t_k$) and weights ($c_n$, $c_{nr}$, $c_k$).

2. Reconstruction method according to claim 1, wherein said set of regularly spaced sampled values comprises at least 2K sampled values ($y_s[n]$, y(nT)),
    wherein the class of said first signal (x(t)) is known,
    wherein the bandwidth (B, $|\omega|$) of said first signal (x(t)) is higher than $\omega_m = \pi/T$, T being the sampling interval,
    wherein the rate of innovation ($\rho$) of said first signal (x(t)) is finite,
    wherein said first signal is faithfully reconstructed from said set of sampled values by solving a structured linear system depending on said known class of signal.

3. Reconstruction method according to claim 1, wherein the reconstructed signal (x(t)) is a faithful representation of the sampled signal (y(t)) or of a signal ($x_i(t)$) related to said sampled signal (y(t)) by a known transfer function ($\phi(t)$).

4. Reconstruction method according to claim 3, wherein said transfer function ($\phi(t)$) includes the transfer function of a measuring device (7, 9) used for acquiring said second signal (y(t)) and/or of a transfer channel (5) over which said second signal (y(t)) has been transmitted.

5. Reconstruction method according to claim 1, wherein the reconstructed signal (x(t)) can be represented as a sequence of known functions ($\gamma(t)$) weighted by said weights ($c_k$) and shifted by said shifts ($t_k$).

6. Reconstruction method according to claim 1, wherein the sampling rate is at least equal to the rate of innovation ($\rho$) of said first signal (x(t)).

7. Reconstruction method according to claim 1, wherein a first system of equations is solved in order to retrieve said shifts ($t_k$) and a second system of equations is solved in order to retrieve said weights ($c_k$).

8. Reconstruction method according to claim 7, wherein the Fourier coefficients (X[m]) of said sample values ($y_s[n]$) are computed in order to define the values in said first system of equations.

9. Reconstruction method according to claim 1, including the following steps:
    finding at least 2K spectral values (X[m]) of said first signal (x(t)),
    using an annihilating filter for retrieving said arbitrary shifts ($t_n$, $t_k$) from said spectral values (X[m]).

10. Reconstruction method according to claim 1, wherein said first signal (x(t)) is a periodic signal with a finite rate of innovation ($\rho$).

11. Reconstruction method according to claim 10, wherein said first signal (x(t)) is a periodical piecewise polynomial signal, said reconstruction method including the following steps:
    finding 2K spectral values (X[m]) of said first signal (x(t)),
    using an annihilating filter for finding a differentiated version ($x^{R+1}(t)$) of said first signal (x(t)) from said spectral values, integrating said differentiated version to find said first signal.

12. Reconstruction method according to claim 10, wherein said first signal (x(t)) is a finite stream of weighted Dirac pulses $$\left(x(t) = \sum_{k=0}^{K-1} c_k \delta(t - t_k)\right),$$

said reconstruction method including the following steps:
  finding the roots of an interpolating filter to find the shifts ($t_n$, $t_k$) of said pulses, solving a linear system to find the weights (amplitude coefficients) ($c_n$, $c_k$) of said pulses.

13. Reconstruction method according to claim 1, wherein said first signal (x(t)) is a finite length signal with a finite rate of innovation (ρ).

14. Reconstruction method according to claim 13, wherein said reconstructed signal (x(t)) is related to the sampled signal (y(t)) by a sin c transfer function (φ(t)).

15. Reconstruction method according to claim 13, wherein said reconstructed signal (x(t)) is related to the sampled signal (y(t)) by a Gaussian transfer function ($\phi_o(t)$).

16. Reconstruction method according to claim 1, wherein said first signal (x(t)) is an infinite length signal in which the rate of innovation (ρ, $ρ_T$) is locally finite, said reconstruction method comprising a plurality of successive steps of reconstruction of successive intervals of said first signal (x(t)).

17. Reconstruction method according to claim 16, wherein said reconstructed signal (x(t)) is related to the sampled signal (y(t)) by a spline transfer function (φ(t)).

18. Reconstruction method according to claim 16, wherein said first signal (x(t)) is a bilevel signal.

19. Reconstruction method according to claim 16, wherein said first signal (x(t)) is a bilevel spline signal.

20. Reconstruction method according to claim 1, wherein said first signal (x(t)) is a CDMA or a Ultra-Wide Band signal.

21. A method for sampling a first signal (x(t)), wherein said first signal (x(t)) can be represented over a finite time interval (τ) by the superposition of a finite number (K) of known functions (δ(t), γ(t), γr(t)) delayed by arbitrary shifts ($t_n$, $t_k$) and weighted by arbitrary amplitude coefficients ($c_n$, $c_k$), said method comprising:
  convoluting, using a digital processing system, said first signal (x(t)) with a sampling kernel ((φ(t), φ(t)) and using a regular sampling frequency (f, 1/T),
  choosing, using the digital processing system, said sampling kernel ((φ(t), φ(t)) and said sampling frequency (f, 1/T) such that sampled values ($y_s[n]$, y(nT)) completely specify said first signal (x(t)), and
  reconstructing, using the digital processing system, said first signal (x(t)), wherein said sampling frequency (f, 1/T) is lower than the frequency given by the Shannon theorem, but greater than or equal to twice said finite number (K) divided by said finite time interval (τ).

22. Sampling method according to claim 21, wherein said first signal (x(t)) is not bandlimited, and wherein said sampling kernel (φ(t)) is chosen so that the number of non-zero sampled values is greater than 2K.

* * * * *